(12) United States Patent
Han et al.

(10) Patent No.: US 8,150,359 B2
(45) Date of Patent: Apr. 3, 2012

(54) MULTIPLE FREQUENCY BAND HYBRID RECEIVER

(75) Inventors: Dong Ok Han, Gyunggi-do (KR); Jeong Hoon Kim, Seoul (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 313 days.

(21) Appl. No.: 12/629,609

(22) Filed: Dec. 2, 2009

(65) Prior Publication Data

US 2010/0304703 A1 Dec. 2, 2010

(30) Foreign Application Priority Data

Jun. 1, 2009 (KR) ........................ 10-2009-0048150

(51) Int. Cl.
*H04B 1/26* (2006.01)
(52) U.S. Cl. .......... 455/324; 455/73; 455/323; 455/313; 455/266; 375/327
(58) Field of Classification Search .................. 455/324, 455/73, 323, 313, 266; 375/327
See application file for complete search history.

(56) References Cited

U.S. PATENT DOCUMENTS

| | | | |
|---|---|---|---|
| 5,974,305 A | 10/1999 | Matero | |
| 6,335,952 B1 * | 1/2002 | Lee et al. | 375/327 |
| 6,510,185 B2 * | 1/2003 | Lee et al. | 375/327 |
| 2006/0068746 A1 * | 3/2006 | Feng et al. | 455/323 |
| 2007/0243832 A1 * | 10/2007 | Park et al. | 455/73 |

FOREIGN PATENT DOCUMENTS

KR 1020080034238 A 4/2008

OTHER PUBLICATIONS

Korean Office Action for patent application No. 10-2009-0048150, issued Jan. 3, 2011.

* cited by examiner

*Primary Examiner* — Sanh Phu
(74) *Attorney, Agent, or Firm* — Lowe, Hauptman, Ham & Berner, LLP

(57) ABSTRACT

A multiple frequency band hybrid receiver includes a plurality of input terminals to which different frequency band signals are respectively inputted; a plurality of mixers connected to the plurality of input terminals sequentially, receiving the different frequency band signals respectively, and down-converting frequencies of the received frequency band signals to predetermined frequencies; an output terminal outputting baseband signals. Each mixer receives a signal from an input terminal connected thereto or another mixer. One of the plurality of mixers receives the lowest frequency band signal, converts a frequency of the received signal to a baseband frequency, and provides a signal having the baseband frequency to the output terminal. The other mixers each down-convert a frequency of a received signal to a frequency band of a signal which is inputted into another mixer.

5 Claims, 3 Drawing Sheets

MULTIPLE FREQUENCY BAND HYBRID RECEIVER

CROSS-REFERENCE TO RELATED APPLICATIONS

This application claims the priority of Korean Patent Application No. 10-2009-0048150 filed on Jun. 1, 2009, in the Korean Intellectual Property Office, the disclosure of which is incorporated herein by reference.

BACKGROUND OF THE INVENTION

1. Field of the Invention

The present invention relates to a multiple frequency band hybrid receiver, and more particularly, to a multiple frequency band hybrid receiver employing both homodyne (direct conversion) and heterodyne methods, in which at least one mixer is used in common in the signal processing according to both methods, whereby the total chip area required for the realization of the receiver can be reduced.

2. Description of the Related Art

As methods of converting a Radio Frequency (RF) signal to a baseband signal, a homodyne (direct conversion) method and a heterodyne method using an Intermediate Frequency (IF) have generally been known.

Multiple frequency band communications for receiving two or more signals usually employ a built-in front-end receiver including low noise amplifiers (LNAs) and mixers relative to the number of signals desired to be received. For example, a wireless local area network (WLAN) system employing IEEE 802.11n Standard is a dual-band system using both a 2 GHz band (IEEE 802.11b and IEEE 802.11g) and a 5 GHz band (IEEE 802.11a), so the WLAN system needs to have two built-in front-end receivers. When the WLAN system supports n number of multiple input multiple output (MIMO) units, the number of front-end receivers increases n times.

In order to enable communications using a currently used direct conversion method, an RF signal, amplified by an LNA, is inputted into a mixer such that its frequency is down-converted to a baseband frequency. This down-conversion needs a local oscillation (LO) frequency relative to a frequency range desired to be down-converted. As methods of generating an LO frequency inputted into a mixer, the direct generation, dual division, and dual multiplication of a voltage controlled oscillator (VCO) frequency have been known. The direct generation method may be problematic due to the pulling of the LO frequency. The dual division method requires a VCO oscillating at a frequency that is twice that of the required LO frequency, thereby causing difficulty in implementation. The dual multiplication method requires a separate phase shifter so as to generate in-phase and quadrature-phase (I/Q) signals. In general, when the IEEE 802.11n WLAN employs the dual division method, the VCO oscillates at 10 to 12 GHz and an LO signal of an RF band (5 GHz) is created, so there is a difficulty in the realization of the VCO and a phase locked loop (PLL).

Meanwhile, in the case of a heterodyne method, there is no need for a high frequency oscillation since an RF signal is not directly converted to a baseband signal, but is converted to an IF signal. For example, in the case that the IEEE 802.11n WLAN employs the heterodyne method, since it is unnecessary to oscillate at a very high frequency of 10 to 12 GHz, it is much easier to realize the VCO and the PLL, as compared to the direct conversion method. However, when a heterodyne mixer having a high IF is used, the high IF causes a difficulty in the design of the mixer and necessitate the use of an inductor or capacitor within the mixer or the addition of a separate band pass filter, whereby total chip area and production costs increase.

SUMMARY OF THE INVENTION

An aspect of the present invention provides a multiple frequency band hybrid receiver employing both homodyne (direct conversion) and heterodyne methods, in which at least one mixer is used in common in the signal processing according to both methods and the load of a heterodyne mixer using a high intermediate frequency is replaced with an inductor of a low noise amplifier located in front of the shared mixer, whereby the total chip area required for the realization of the receiver can be reduced.

According to an aspect of the present invention, there is provided a multiple frequency band hybrid receiver, the receiver including: a plurality of input terminals to which different frequency band signals are respectively inputted; a plurality of mixers connected to the plurality of input terminals sequentially, receiving the different frequency band signals respectively, and down-converting frequencies of the received frequency band signals to predetermined frequencies; and an output terminal outputting baseband signals. Each of the plurality of mixers receives a signal from an input terminal connected thereto or another mixer. One of the plurality of mixers receives a signal having the lowest frequency band inputted by an input terminal, converts a frequency of the received signal to a baseband frequency, and provides a signal having the baseband frequency to the output terminal. Each of the other mixers among the plurality of mixers down-converts a frequency of a received signal to a frequency band of a signal which is inputted into another mixer.

The plurality of input terminals may include a first input terminal to which a first signal having a first frequency band is inputted, and a second input terminal to which a second signal having a second frequency band is inputted. The plurality of mixers may include a first mixer connected to the first input terminal and a second mixer connected to the second input terminal. The second mixer may down-convert a frequency of the second signal to the first frequency band and provide a signal having the down-converted frequency as an input of the first miter. The first mixer may convert the first signal or the signal having the frequency down-converted to the first frequency band by the second mixer, to a baseband signal.

The plurality of input terminals may include a first input terminal to which a first signal having a first frequency band is inputted, a second input terminal to which a second signal having a second frequency band higher than the first frequency band is inputted, and a third input terminal to which a third signal having a third frequency band higher than the second frequency band is inputted. The plurality of mixers may include a first mixer connected to the first input terminal, a second mixer connected to the second input terminal, and a third mixer connected to the third input terminal. The third mixer may down-convert a frequency of the third signal to the second frequency band and provide a signal having the down-converted frequency as an input of the second mixer. The second mixer may down-convert a frequency of the second signal or the signal down-converted by the third mixer to the first frequency band and provide a signal having the down-converted frequency as an input of the first mixer. The first mixer may down-convert the first signal or the signal having the frequency down-converted to the first frequency band by the second mixer, to a baseband signal.

The multiple frequency band hybrid receiver may further include a plurality of low noise amplifiers disposed between the respective input terminals and the respective mixers.

One of the plurality of low noise amplifiers and one of the plurality of mixers may share a load with each other. The one of the plurality of mixers is connected to a power supply voltage VDD through the load included in the one of the plurality of low noise amplifiers.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
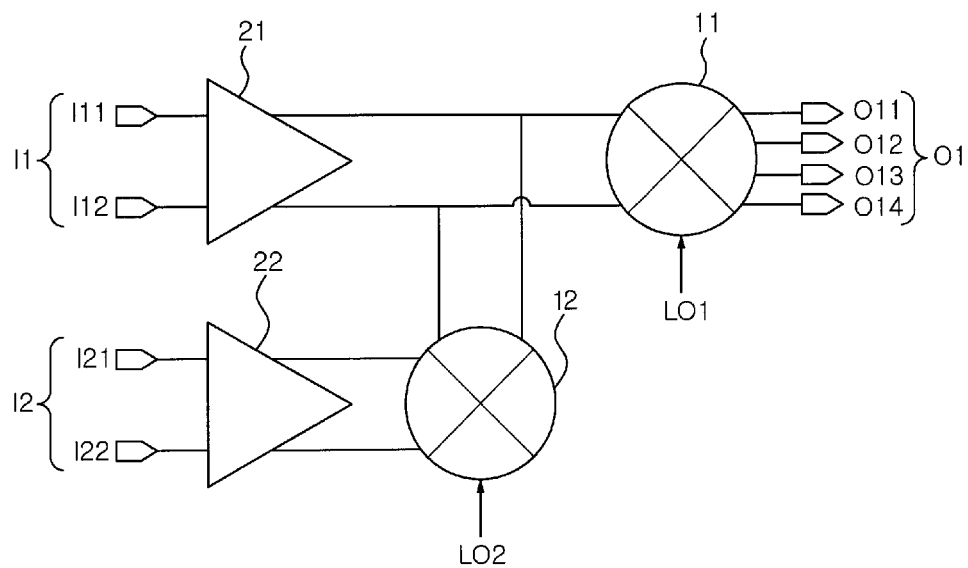
FIG. 1 is a schematic circuit diagram illustrating a multiple frequency band hybrid receiver according to an exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity.

FIG. 1 is a schematic circuit diagram illustrating a multiple frequency band hybrid receiver according to an exemplary embodiment of the present invention. Particularly, FIG. 1 shows a multiple frequency band hybrid receiver receiving two different frequency band signals and converting them to baseband signals, respectively.

As shown in FIG. 1, a multiple frequency band hybrid receiver according to an exemplary embodiment of the invention includes a plurality of input terminals I1 and I2, mixers 11 and 12 connected to the respective input terminals sequentially, and an output terminal O1.

This embodiment of the invention may further include a plurality of low noise amplifiers (LNAs) 21 and 22, each of which is disposed between the input terminal I1 and the mixer 11 and between the input terminal I2 and the mixer 12, respectively.

The plurality of input terminals may include a first input terminal I1 and a second input terminal I2, to which different frequency band signals are inputted. In the case that the multiple frequency band hybrid receiver according to the exemplary embodiment of the invention is applied to a system using balance signals, the input terminals I1 and I2 may include two input terminals I11 and I12, and I21 and I22, respectively, to which the balance signals having a phase difference of 180° in the same frequency band are respectively inputted. Throughout the specification and the accompanying claims, a plurality of physical input terminals, to which signals having a balance or in-phase and quadrature-phase (I/Q) relationship in the same frequency band are outputted, will be considered to be one input terminal. The first input terminal I1 may have a signal having a first frequency band (first frequency band signal) inputted thereto. The second input terminal I2 may have a signal having a second frequency band (second frequency band signal) inputted thereto, in which the second frequency band is higher than the first frequency band.

The plurality of mixers may include a first mixer 11 and a second mixer 12. The first mixer 11 has an input terminal connected to the first input terminal I1, mixes the first frequency band signal inputted from the first input terminal I1 with a first local oscillation (LO) frequency LO1, converts the first frequency band signal to a baseband signal, and outputs the baseband signal into the output terminal O1. That is, the first frequency band signal is converted to the baseband signal by the first mixer 11 using a homodyne (direct conversion) method. The first mixer 11 has the first LO frequency LO1 having a uniform frequency inputted thereto, mixes a received signal with the first LO frequency LO1, converts the signal to the baseband signal, and outputs it. The output terminal of the first mixer 11 is connected to the output terminal O1 of the receiver.

The second mixer 12 mixes a signal inputted into the second input terminal I2 of the receiver with a second LO frequency LO2, and thus down-converts the frequency of the signal inputted into the second input terminal I2. In this invention, the output of the second mixer 12 is inputted as the input of the first mixer 11. The second mixer 12 converts the frequency of the signal inputted into the second input terminal I2 to the first frequency band, so as to be inputted to the first mixer 11, by using the second LO frequency LO2. That is, the second frequency band signal inputted into the second input terminal I2 is down-converted to the first frequency band signal, i.e., an intermediate frequency (IF) band signal, by the second mixer 12, and this down-converted signal of the first frequency band is again converted to a baseband signal by the first mixer 11, and is thus outputted into the output terminal O1. Like this, the second frequency band signal inputted into the second input terminal I2 is converted to the baseband signal using a heterodyne method.

The output terminal O1 is a terminal where a baseband signal is outputted. The output terminal O1 is connected to the output terminal of the first mixer 11. As shown in FIG. 1, when the signals inputted into the mixers 11 and 12 are balance signals and two LO frequencies of the same frequency having a phase difference of 90° are provided to the first mixer 11 so as to generate I/Q signals in the process of mixing, the I/Q signals corresponding to the respective balance signals are generated, resulting in a total of four outputs. Accordingly, the output terminal O1 may be configured to include four output terminals O11 to O14.

As described above with reference to FIG. 1, this invention allows one mixer 11 to be shared in the frequency conversions according to the homodyne and heterodyne methods. As described in FIG. 2, in a typical multiple frequency band hybrid receiver employing both homodyne and heterodyne methods, a first mixer 31 converting a first frequency band signal using the homodyne method, and a second mixer 32 converting a second frequency band signal to an IF band signal and a third mixer 33 converting the IF band signal to a baseband signal for the heterodyne conversion of the second frequency band signal are necessarily required. That is, the receiver according to the related art requires one further mixer so as to convert two signals of the same frequency band to baseband signals, as compared to the receiver according to the exemplary embodiment of the invention. This requires one further voltage controlled oscillator (VCO) so as to provide the mixers 31 to 33 with LO frequencies LO1 to LO3.

Figure 2:
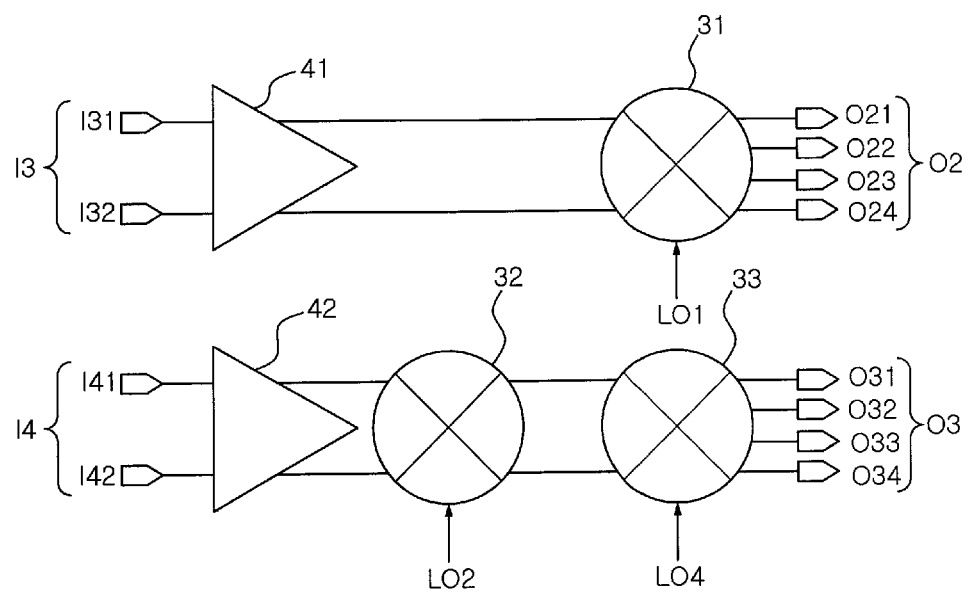
FIG. 2 is a schematic circuit diagram illustrating a typical related art multiple frequency band hybrid receiver employing both homodyne and heterodyne methods.

In contrast to the typical multiple frequency band hybrid receiver as shown in FIG. 2, the present invention employs a configuration in which one mixer is used in common in the frequency conversions according to different methods, by harmonizing an IF band used in the heterodyne method with a frequency band of a signal inputted into another mixer used in another frequency band. This allows for a reduction in the number of mixers used in the receiver, as well as in the number of VCOs for generating the LO frequencies, thereby reducing total chip area and production costs.

Referring to FIG. 1, the operations of the multiple frequency band hybrid receiver according to the exemplary embodiment of the invention will be described below using an example.

The multiple frequency band hybrid receiver according to the exemplary embodiment of the invention as shown in FIG. 1 may be applicable to a dual-band wireless local area network (WLAN) using 2 GHz and 5 GHz radio frequency (RF) signals. A 2.4 GHz WLAN signal may be inputted into the first input terminal I1 and a 5 GHz WLAN signal may be inputted into the second input terminal I2.

The 2.4 GHz WLAN signal inputted into the first input terminal I1 is amplified through a low noise amplifier (LNA) 21, and then inputted into the first mixer 11. The first mixer 11 has a first LO frequency LO1 inputted thereto, so as to directly convert the 2.4 GHz WLAN signal to a baseband signal. The first LO frequency LO1 may be generated and provided by a VCO (not shown). The VCO may have the first LO frequency LO1 corresponding to 2.4 GHz in order that it may directly convert the 2.4 GHz WLAN signal to the baseband signal. The 2.4 GHz WLAN signal inputted into the first input terminal I1 is directly converted to the baseband signal by the first mixer 11.

Then, the 5 GHz WLAN signal inputted into the second input terminal I2 is amplified through an LNA 22, and then inputted into the second mixer 12. The second mixer 12 has a second LO frequency LO2 inputted thereto, so as to convert the 5 GHz WLAN signal to an IF band signal. The IF band signal generated by the second mixer 12 is inputted into the first mixer 11, and then down-converted to a baseband signal. Therefore, the IF band signal generated by the second mixer 12 should have the same frequency as the signal inputted into the first input terminal I1 in order that it may be converted to the baseband signal by using the first LO frequency LO1 inputted into the first mixer 11. That is, the second LO frequency LO2 inputted into the second mixer 12 should have a frequency of approximately 3 GHz so as to down-convert the 5 GHz WLAN signal to the 2.4 GHz WLAN signal. Like this, the 5 GHz WLAN signal inputted into the second input terminal I2 is mixed with the approximately 3 GHz second LO frequency LO2 by the second mixer 12, and is thus converted to the 2.4 GHz IF band signal. This IF band signal is mixed with the first LO frequency LO1 by the first mixer 11, and is thus converted to the baseband signal. Like this, the 5 GHz WLAN signal is converted to the baseband signal by employing the heterodyne method using the IF.

As described above, this invention provides the multiple frequency band hybrid receiver employing both the homodyne and heterodyne methods, in which one or more mixers are used in a shared manner in both methods, and thus the advantages of easier implementation, reduced electronic components, and reduced production costs may be expected.

Figure 3:
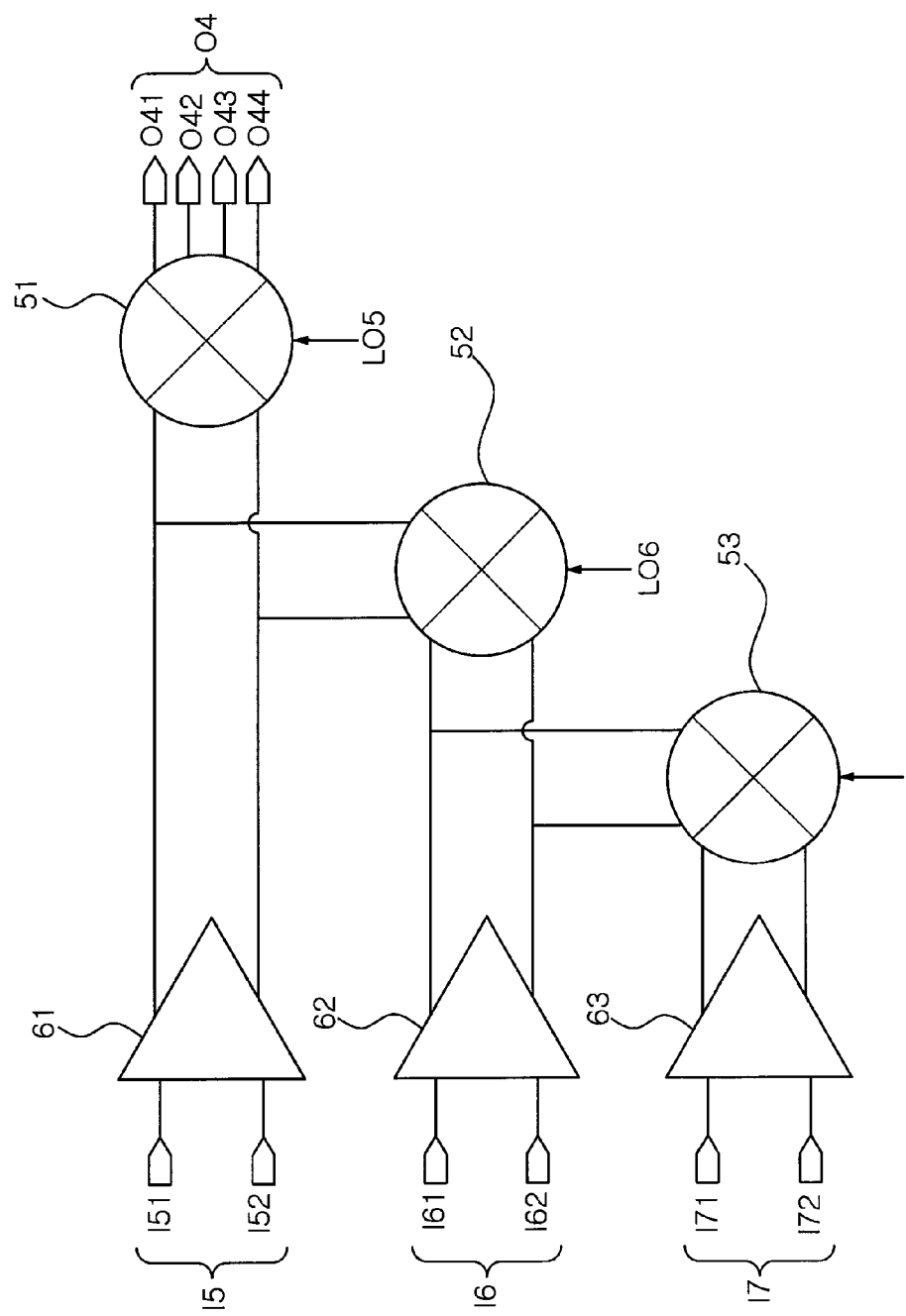
FIG. 3 is a schematic circuit diagram illustrating a multiple frequency band hybrid receiver according to another exemplary embodiment of the present invention.

FIG. 3 is a schematic circuit diagram illustrating a multiple frequency band hybrid receiver according to another exemplary embodiment of the present invention. This embodiment of FIG. 3 presents a multiple frequency band hybrid receiver receiving three different frequency band signals.

The receiver according to the exemplary embodiment as shown in FIG. 3 may include a first input terminal I5 to which a first signal having a first frequency band is inputted, a second input terminal I6 to which a second signal having a second frequency band higher than the first frequency band is inputted, and a third input terminal I7 to which a third signal having a third frequency band higher than the second frequency band is inputted.

Also, the receiver according to the exemplary embodiment as shown in FIG. 3 may include a first mixer 51 connected to the first input terminal I5, a second mixer 52 connected to the second input terminal I6, and a third mixer 53 connected to the third input terminal I7. The first to third mixers 51 to 53 may have LO frequencies LO5 to LO7 inputted thereto, respectively, in which the LO frequencies LO5 to LO7 are used for the frequency down-conversion of the respective inputted signals. Furthermore, the respective input terminals I5 to I7 and the mixers 51 to 53 connected thereto may have LNAs 61 to 63 disposed therebetween such that the signals inputted into the respective input terminals I5 to I7 may be amplified and provided to the mixers 51 to 53.

According to the exemplary embodiment of the invention as shown in FIG. 3, the third mixer 53 down-converts the frequency of the third signal inputted into the third input terminal I7 to a frequency band matching that of the second signal. The second mixer 52 down-converts the frequency of the second signal inputted into the second input terminal I6 to a frequency band matching that of the first signal. Also, the second mixer 52 down-converts the signal down-converted and outputted by the third mixer 53 to a signal having a frequency band matching that of the first signal. The first mixer 51 down-converts the frequency of the first signal inputted from the first input terminal I5 to a baseband, and then outputs the baseband signal into an output terminal O4. Also, the first mixer 51 down-converts the signal down-converted by the second mixer 52 and having a frequency band matching that of the first signal to a baseband signal, and then outputs the baseband signal to the output terminal O4.

For example, the exemplary embodiment of the invention as shown in FIG. 3 may be realized to a multiple frequency band hybrid receiver used in three applications using 2 GHz (first signal), 5 GHz (second signal), and 7 GHz (third signal) in S-band and C-band. In this case, the LO frequency LO5 inputted into the first mixer 51 may be 2 GHz so as to convert the 2 GHz first signal to a baseband signal. Also, the LO frequency LO6 inputted into the second mixer 52 may be 3 GHz so as to down-convert the 5 GHz second signal to a signal having a 2 GHz bandwidth equal to the frequency band of the first signal. Also, the LO frequency LO7 inputted into the third mixer 53 may be 2 GHz so as to down-convert the 7 GHz third signal to a signal having a 5 GHz bandwidth equal to the frequency band of the second signal. In this example, since the first and third mixers 51 and 53 have the same LO frequency inputted thereto, the multiple frequency band hybrid receiver may use two VCOs. Also, since the maximum LO frequency generated in the VCOs is no more than 3 GHz, in the case that a phase locked loop (PLL) according to a dual devision method is used, the oscillation frequency of the VCO will be just 6 GHz. If the third signal is directly down-converted to a baseband signal using the PLL according to the dual division method, there may be a difficulty in that the VCO should output a very high LO frequency of 14 GHz. According to the present invention, in the case that a plurality of signals having different frequency bands are converted to baseband signals, the mixers may be used in common for the conversion of each signal, thereby achieving a reduction in the number of mixers. Moreover, in the case that a PLL according to the division method is used, the oscillation frequency outputted by the VCO does not need to be high.

Figure 4:
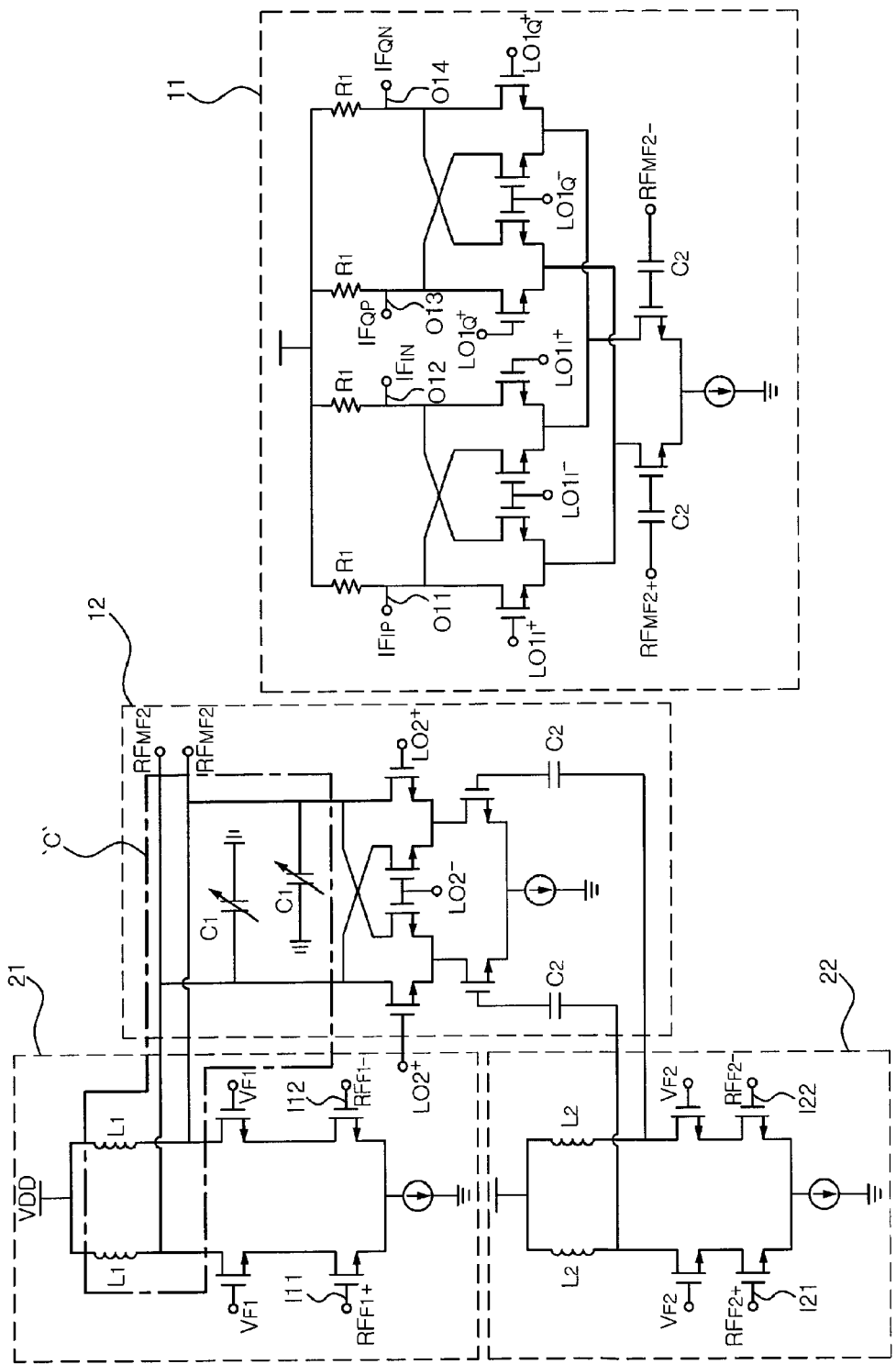
FIG. 4 is a detailed circuit diagram illustrating the multiple frequency band hybrid receiver according to the exemplary embodiment of the present invention as shown in FIG. 1.

FIG. 4 is a detailed circuit diagram illustrating the multiple frequency band hybrid receiver according to the exemplary embodiment of the present invention as shown in FIG. 1. In FIG. 4, the same components as shown in FIG. 1 will be referred to using the same reference numerals.

As shown in FIG. 4, the first mixer 11 may be configured to be a double balanced mixer outputting balance signals having an I/Q relationship, and the second mixer 12 may be configured to be a single balanced mixer outputting balance signals.

The first mixer 11 has a total of four LO signals LO1$_I$+, LO1$_I$−, LO1$_Q$+, and LO1$_Q$− inputted thereto, in which the LO signals have the same frequency and different phases. The second mixer 12 has two LO signals LO2+ and LO2− inputted thereto, in which the LO signals have a balance relationship. The first and second mixers 11 and 12 have a difference in the structure of a switching pair for the input of LO signals according to whether outputted signals are I/Q signals. However, both of the mixers 11 and 12 have a common structure including a switching pair, a transconducting stage connected to a terminal to which a received signal is inputted, and a load provided between a power supply voltage VDD and the switching pair.

Furthermore, the LNAs 21 and 22 connected to the input terminals I11, I12, I21, and I22 and having a balance structure may be configured to include load inductors L1 and L2 and have a differential cascode structure so as to amplify the balance signals. According to applied circuit types, the LNAs 21 and 22 may be configured to have a single input and a differential output.

As shown in FIG. 4, the load C of the second mixer 12 according to this invention may include the inductor L1 included in the load of the first LNA 21. That is, the second mixer 12 and the first LNA 21 may be configured to share the load with each other. Particularly, the load C of the second mixer 12 may be configured to have the inductor L1, which is the load of the first LNA 21, and a capacitor C1 included in the second mixer 12 itself. An existing heterodyne down-conversion requires a filter so as to process an image signal generated due to a high IF. However, according to the exemplary embodiment of this invention, since the inductor L1 of the first LNA 21 is used as the load of the second mixer 12, the combination of inductance of the inductor L1 and capacitance of the capacitor C1 may produce the same effect as an LC filter.

As stated above, the mixer and the LNA share the load, and the sharing of the load actualizes the LC filter, thereby resolving the problem of high IF and image signal processing occurring in the heterodyne method, without an additional filter.

As set forth above, according to exemplary embodiments of the invention, at least one mixer is used in a shared manner in the frequency conversions according to different methods, by harmonizing the IF band used in the heterodyne method with a frequency band of a signal inputted into another mixer used in another frequency band. This allows for a reduction in the number of mixers used in the receiver, as well as in the number of VCOs for generating the LO frequencies, thereby reducing total chip area and production costs.

Also, the realization of the LC filter by the sharing of the load between the mixer and the LNA may resolve selectivity of outputted signals or an image problem occurring in the heterodyne method, without an additional filter.

While the present invention has been shown and described in connection with the exemplary embodiments, it will be apparent to those skilled in the art that modifications and variations can be made without departing from the spirit and scope of the invention as defined by the appended claims.

What is claimed is:

1. A multiple frequency band hybrid receiver comprising:
   a plurality of input terminals to which different frequency band signals are respectively inputted;
   a plurality of mixers connected to the plurality of input terminals sequentially, receiving the different frequency band signals respectively, and down-converting frequencies of the received frequency band signals to predetermined frequencies; and
   an output terminal outputting baseband signals,
   wherein each of the plurality of mixers receives a signal from an input terminal connected thereto or another mixer,
   one of the plurality of mixers receives a signal having the lowest frequency band inputted by an input terminal, converts a frequency of the received signal to a baseband frequency, and provides a signal having the baseband frequency to the output terminal, and
   each of the other mixers among the plurality of mixers down-converts a frequency of a received signal to a frequency band of a signal which is inputted into another mixer.

2. The multiple frequency band hybrid receiver of claim 1, wherein the plurality of input terminals comprise:
   a first input terminal to which a first signal having a first frequency band is inputted; and
   a second input terminal to which a second signal having a second frequency band is inputted, and
   the plurality of mixers comprise:
   a first mixer connected to the first input terminal; and
   a second mixer connected to the second input terminal,
   wherein the second mixer down-converts a frequency of the second signal to the first frequency band and provides a signal having the down-converted frequency as an input of the first mixer, and
   the first mixer converts the first signal or the signal having the frequency down-converted to the first frequency band by the second mixer, to a baseband signal.

3. The multiple frequency band hybrid receiver of claim 1, wherein the plurality of input terminals comprise:
   a first input terminal to which a first signal having a first frequency band is inputted;
   a second input terminal to which a second signal having a second frequency band higher than the first frequency band is inputted; and
   a third input terminal to which a third signal having a third frequency band higher than the second frequency band is inputted, and
   the plurality of mixers comprise:
   a first mixer connected to the first input terminal;
   a second mixer connected to the second input terminal; and
   a third mixer connected to the third input terminal,
   wherein the third mixer down-converts a frequency of the third signal to the second frequency band and provides a signal having the down-converted frequency as an input of the second mixer,
   the second mixer down-converts a frequency of the second signal or the signal down-converted by the third mixer to the first frequency band and provides a signal having the down-converted frequency as an input of the first mixer, and
   the first mixer down-converts the first signal or the signal having the frequency down-converted to the first frequency band by the second mixer, to a baseband signal.

4. The multiple frequency band hybrid receiver of claim 1, further comprising a plurality of low noise amplifiers disposed between the respective input terminals and the respective mixers.

5. The multiple frequency band hybrid receiver of claim 4, wherein one of the plurality of low noise amplifiers and one of the plurality of mixers share a load with each other.

* * * * *